(12) United States Patent
Kim et al.

(10) Patent No.: US 10,615,884 B2
(45) Date of Patent: Apr. 7, 2020

(54) LOW FREQUENCY ULTRASONIC COMMUNICATION SYSTEM, LOW FREQUENCY ULTRASONIC COMMUNICATION METHOD, LOW FREQUENCY ULTRASONIC TRANSMITTING APPARATUS, AND LOW FREQUENCY ULTRASONIC RECEIVING APPARATUS

(71) Applicant: GWANGJU INSTITUTE OF SCIENCE AND TECHNOLOGY, Gwangju (KR)

(72) Inventors: Hong Kook Kim, Gwangju (KR); Kwang Myung Jeon, Gwangju (KR)

(73) Assignee: GWANGJU INSTITUTE OF SCIENCE AND TECHNOLOGY, Gwangju (KR)

(*) Notice: Subject to any disclaimer, the term of this patent is extended or adjusted under 35 U.S.C. 154(b) by 236 days.

(21) Appl. No.: 15/582,509

(22) Filed: Apr. 28, 2017

(65) Prior Publication Data
US 2017/0317764 A1 Nov. 2, 2017

Related U.S. Application Data

(60) Provisional application No. 62/329,208, filed on Apr. 29, 2016.

(51) Int. Cl.
*H04B 11/00* (2006.01)
*H03M 13/15* (2006.01)
(Continued)

(52) U.S. Cl.
CPC ........ *H04B 11/00* (2013.01); *H03M 13/1505* (2013.01); *H04L 1/0057* (2013.01); *H04L 27/2092* (2013.01); *H04L 27/22* (2013.01)

(58) Field of Classification Search
CPC ........ H04B 11/00; H04B 13/00; H04B 13/02; H04L 27/22; H04L 27/2092; H04L 1/0057; H03M 13/1505
See application file for complete search history.

(56) References Cited

U.S. PATENT DOCUMENTS 6,130,859 A * 10/2000 Sonnenschein ........ H04B 13/02
340/850
6,424,822 B1 * 7/2002 Mekuria ............. H04M 1/6505
375/240
(Continued)

FOREIGN PATENT DOCUMENTS

KR       20100031445 A    3/2010
KR    10-2010-0120042 A   11/2010
KR       20130014086 A    2/2013

OTHER PUBLICATIONS

V. Gerasimov and W. Bender, "Things that talk: using sound for device-to-device and device-to-human communication," IBM Systems Journal, vol. 39, No. 3.4, pp. 530-546, Apr. 2000.
(Continued)

*Primary Examiner* — Ian J Lobo
(74) *Attorney, Agent, or Firm* — Loza & Loza, LLP; Heidi L. Eisenhut

(57) ABSTRACT

A low frequency ultrasonic communication system includes: a low frequency ultrasonic transmitting apparatus configured to transmit data using a low frequency ultrasonic wave; and a low frequency ultrasonic receiving apparatus configured to recover the data by processing a low frequency ultrasonic reception signal transmitted from the low frequency ultrasonic transmitting apparatus. In communication between the transmitting apparatus and the receiving apparatus, modulation is performed using a DPSK scheme, and FEC coding is used to perform channel coding before the modulation.

12 Claims, 8 Drawing Sheets

(51) Int. Cl.
*H04L 1/00* (2006.01)
*H04L 27/20* (2006.01)
*H04L 27/22* (2006.01)

(56) References Cited

U.S. PATENT DOCUMENTS

| | | | | |
|---|---|---|---|---|
| 8,886,055 | B1* | 11/2014 | Morero | H04L 1/0041 398/192 |
| 2001/0033621 | A1* | 10/2001 | Khayrallah | H03M 7/3002 375/244 |
| 2003/0212549 | A1* | 11/2003 | Steentra | H04B 11/00 704/201 |
| 2006/0136797 | A1* | 6/2006 | Cai | H03M 13/3723 714/752 |
| 2012/0171963 | A1* | 7/2012 | Tsfaty | H04B 11/00 455/41.3 |
| 2015/0063495 | A1* | 3/2015 | Qu | H04L 27/22 375/330 |
| 2016/0196825 | A1* | 7/2016 | Chen | H04B 11/00 704/501 |

OTHER PUBLICATIONS

H. Lee, T. H. Kim, J. W. Choi, and S. Choi, "Chirp signal-based aerial acoustic communication for smart devices," in Proc. of IEEE Conf. on Computer Communications (INFOCOM), Hong Kong, China, pp. 2407-2415, Apr. 2006.

Jeon et al., Non-Coherent Low-Frequency Ultrasonic Communication System with Optimum Symbol Length, International Journal of Distributed Sensor Networks, May 17, 2016, pp. 1-8, vol. 2016, Article ID 9713180, Hindawi Publishing Corporation.

* cited by examiner

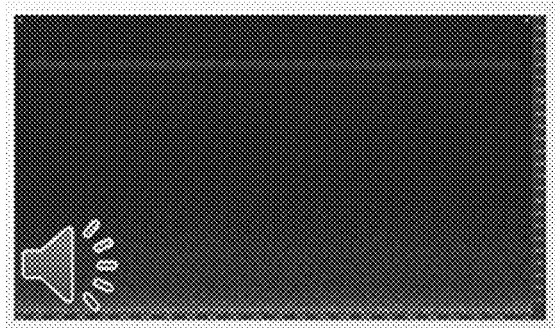 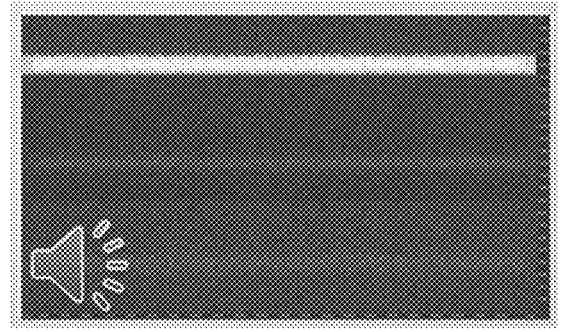
FIG. 4a                    FIG. 4b

LOW FREQUENCY ULTRASONIC COMMUNICATION SYSTEM, LOW FREQUENCY ULTRASONIC COMMUNICATION METHOD, LOW FREQUENCY ULTRASONIC TRANSMITTING APPARATUS, AND LOW FREQUENCY ULTRASONIC RECEIVING APPARATUS

CLAIM OF PRIORITY UNDER 35 U.S.C. § 119

The present Utility Applications for Patent claims priority to U.S. Provisional Application No. 62/329,208 entitled "LOW FREQUENCY ULTRASONIC COMMUNICATION SYSTEM, LOW FREQUENCY ULTRASONIC COMMUNICATION METHOD, LOW FREQUENCY ULTRASONIC TRANSMITTING APPARATUS, AND LOW FREQUENCY ULTRASONIC RECEIVING APPARATUS" filed Apr. 29, 2016, and hereby expressly incorporated by reference herein.

BACKGROUND

The present disclosure relates to a low frequency ultrasonic communication system for performing communication using an ultrasonic wave, a low frequency ultrasonic communication method, a low frequency ultrasonic transmitting apparatus, and a low frequency ultrasonic receiving apparatus.

Recently, an NFC and Bluetooth system has been widely used for short range communication. However, only devices each having a separate hardware system built therein are available in the NFC and Bluetooth system, and therefore, separate cost is required.

In order to solve such a problem, there is introduced a low frequency ultrasonic communication system for performing communication using a low frequency ultrasonic wave. The low frequency ultrasonic communication system has an advantage that any device having a central processing unit, a microphone, and a speaker can perform communication. Thanks to the advantage, low frequency ultrasonic communication can be performed in any space in which sound can be delivered.

Non-Patent Document 1, identified below, has been introduced as an example of the low frequency communication system. In the Non-Patent Document 1, there is introduced a low frequency ultrasonic (LFU) communication system based on amplitude shift keying (ASK), which is called "Sonicom." However, in the Non-Patent Document 1, synchronization and modulation relies on the energy level of a carrier frequency. This is because communication relies on a channel having high frequency selectivity. For this reason, the communication is considerably weak against channel noise and attenuation. Therefore, according to the Non-Patent Document 1, there is a problem that the maximum transmission range is limited to about 2 m.

In order to solve the problem of the Non-Patent Document, Non-Patent Document 2, identified below, has been introduced. In the Non-Patent Document 2, the maximum transmission distance can be increased up 25 m, using a chirp signal as a modulation symbol. However, according to the Non-Patent Document 2, there is a problem that the transmission speed is remarkably decreased to 16 bps due to inferior modulation efficiency of the chirp signal, in terms of both time and frequency.

Under the above-described circumferences, there is required a low frequency ultrasonic communication system that is robust with respect to a noise environment and a channel variation and can secure a transmission distance of a certain level or higher.

PRIOR ART DOCUMENTS

Non-Patent Documents

1. V. Gerasimov and W. Bender, "Things that talk: using sound for device-to-device and device-to-human communication," IBM Systems Journal, vol. 39, no. 3.4, pp. 530-546, April 2000.
2. H. Lee, T. H. Kim, J. W. Choi, and S. Choi, "Chirp signal-based aerial acoustic communication for smart devices," in Proc. of IEEE Conf. on Computer Communications (INFOCOM), Hong Kong, China, pp. 2407-2415, April 2006.

SUMMARY

Accordingly, an object of the present disclosure is to address the above-noted and other problems.

Another object of the present disclosure is to provide a low frequency ultrasonic communication system that is robust with respect to noise and channel selectivity and can secure a sufficient transmission distance and transmission efficiency, a low frequency ultrasonic communication method, a low frequency ultrasonic transmitting apparatus, and a low frequency ultrasonic receiving apparatus.

In one embodiment, there is provided a low frequency ultrasonic communication system including: a low frequency ultrasonic transmitting apparatus configured to transmit data using a low frequency ultrasonic wave; and a low frequency ultrasonic receiving apparatus configured to recover the data by processing a low frequency ultrasonic reception signal transmitted from the low frequency ultrasonic transmitting apparatus. The low frequency ultrasonic transmitting apparatus and the low frequency ultrasonic receiving apparatus use a DSPK scheme. The data is subjected to FEC encoding to provide improved transmission efficiency.

In another embodiment, there is provided a low frequency ultrasonic transmitting apparatus including: a DPSK modulator configured to provide a symbol by performing DPSK modulation on digital data; a transmission side filter/AGC configured to convert the symbol into a frame by filtering the symbol and controlling a gain; a digital to analog converter configured to convert the frame into an analog signal; and a speaker configured to transmit the analog signal using a low frequency ultrasonic wave.

In still another embodiment, there is provided a low frequency ultrasonic receiving apparatus including: a microphone configured to receive a low frequency ultrasonic wave; an analog to digital converter configured to convert a signal received as an analog signal into a digital reception signal; a reception side filter/AGC configured to filter the received signal and control a gain to obtain an estimation symbol estimated from the received signal; and a DPSK demodulator configured to acquire digital data by performing DPSK demodulation on the estimation symbol.

In still another embodiment, there is provided a low frequency ultrasonic communication method including: channel coding digital data; and performing DPSK modulation on a coding block coded through the channel coding to provide a symbol. Thus, communication can be performed using a low frequency ultrasonic wave as an air wave.

Communication can be optimized by filtering the symbol and controlling a gain of the symbol.

The channel coding may be performed as FEC coding.

The frequency of the low frequency ultrasonic wave used in the system, the transmitting apparatus, the receiving apparatus, and the method may be provided as 18 to 24 KHz, more preferably, 18 to 22 KHz. Accordingly, the low frequency ultrasonic wave can be operated sufficiently corresponding to ready-made products, i.e., a speaker and a microphone, which are equipped in a general device, while not being heard by persons.

According to the present disclosure, actual low frequency ultrasonic communication can be performed using a speaker and a microphone, which are sold as general ready-made products. Here, examples of the ready-made product may be speakers and microphones, which are widely used in mobile terminals of users. In particular, although a low frequency ultrasonic wave is used, data communication can be performed without any problem.

Further scope of applicability of the present disclosure will become apparent from the detailed description given hereinafter. However, it should be understood that the detailed description and specific examples, while indicating preferred embodiments of the disclosure, are given by illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings, which are given by illustration only, and thus are not limitative of the present disclosure, and wherein:

FIGS. 4a, and 4b are views comparing before and after a gain is controlled.

DETAILED DESCRIPTION OF THE EMBODIMENTS

Description will now be given in detail according to exemplary embodiments disclosed herein, with reference to the accompanying drawings. The spirit of the present disclosure is not limited to the exemplary embodiments described in the specification. A person of an ordinary skill in the art understanding the spirit of the present disclosure can easily propose another exemplary embodiment by adding, changing, deleting, etc., of constituent elements within the scope of the present disclosure, which should be construed as being included in the scope of the present disclosure.

Figure 1:
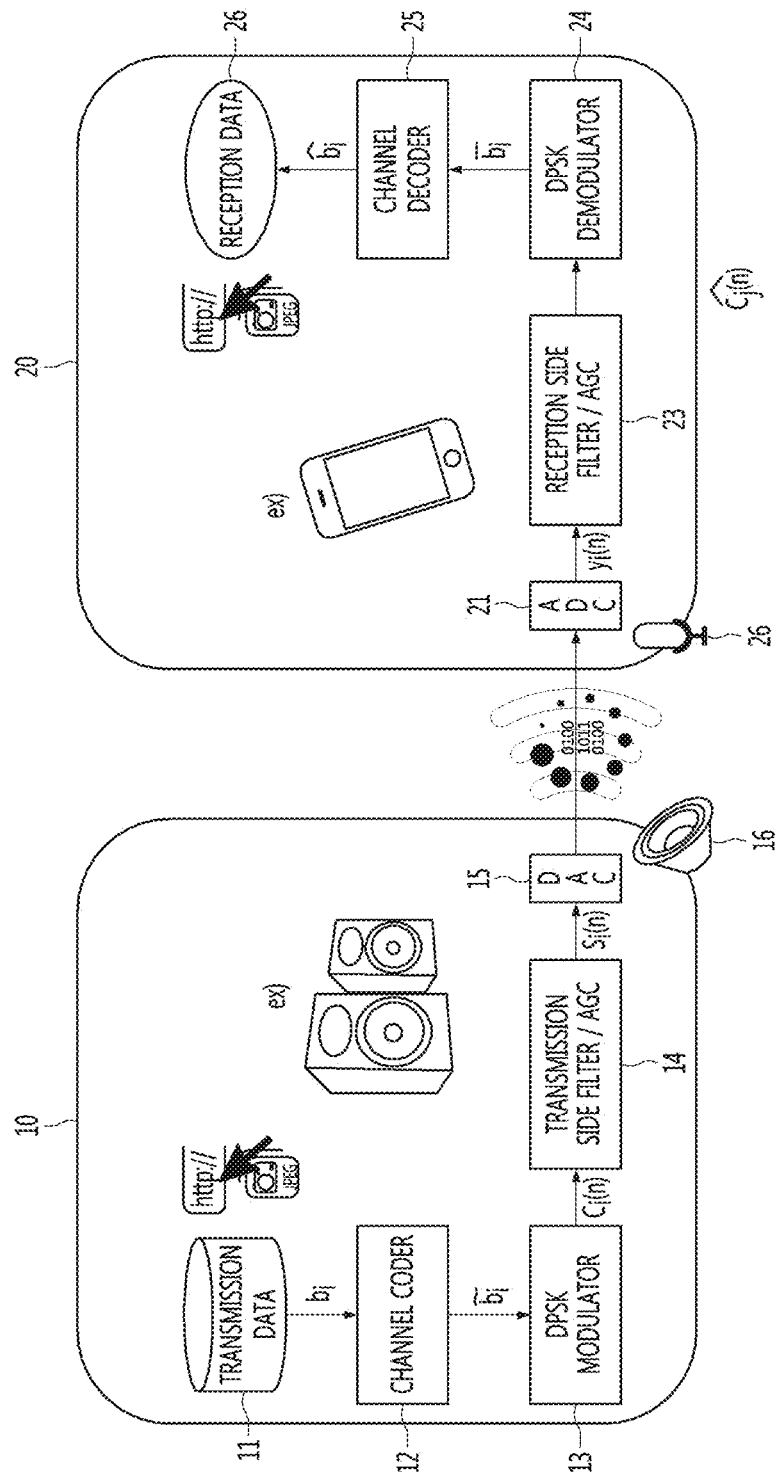
FIG. 1 is a view illustrating a low frequency ultrasonic communication system according to an embodiment.

FIG. 1 illustrates a low frequency ultrasonic communication system according to an embodiment.

Referring to FIG. 1, the low frequency ultrasonic communication system includes a low frequency ultrasonic transmitting apparatus 10 that transmits data using a low frequency ultrasonic wave and a low frequency ultrasonic receiving apparatus 20 that recovers data by demodulating a received low frequency ultrasonic wave.

The low frequency used in the low frequency ultrasonic communication system may have a range of 18 to 24 KHz, more particularly, 18 to 22 KHz. Since people hear frequencies below this range, the frequencies may cause a user inconvenience, which is undesirable. Frequencies above this range generally exceed those of sounds reproducible from speakers used as ready-made products, which is undesirable to be used.

Examples of the low frequency ultrasonic transmitting apparatus 10 may be devices equipped with various speakers, such as personal terminals, audio systems, telephones, computers, and TVs. Examples of the low frequency ultrasonic receiving apparatus 20 may be devices equipped with various microphones, such as personal terminals, audio systems, telephones, computers, and TVs.

The low frequency ultrasonic transmitting apparatus includes a channel coder 12 that channel-codes transmission data 11 ($b_i$) to be transmitted.

The channel coder 12 may add an error corrosion bit using a forward error correction (FEC) encoder. A golay coder may be used as the FEC encoder. The golay coder can decrease a bit error rate (BER) even when signal energy per bit (Eb/N0) is low.

The channel coder 12 codes the transmission data $b_i$, and provides a coded block $\tilde{b}_i$. Subscript i of the coded block denotes a serial number of a packet.

A differential phase shift keying (DPSK) demodulator 13 demodulates the coded block to generate a symbol $c_i(n)$ in a DPSK scheme.

The DPSK scheme and other schemes will be compared and described.

First, in a phase shift keying (PSK) scheme, correlation is to be performed so as to perform synchronization. This increase the consumption of a battery in a general audio device, and it is highly likely that a communication failure will be caused. In addition, it is difficult to actually apply the PSK scheme due to the Doppler Effect. Next, a frequency shift keying (FSK) scheme and an orthogonal frequency division multiplexing (OFDM) scheme use all frequencies. In this case, if an error is caused with respect to any one frequency, all of the frequencies are not used, which is not efficient. In addition, an amplitude shift keying (ASM) scheme is weak in low frequency ultrasonic communication because the signal to noise ratio (SNR) is increased by noise.

A transmission side filter/AGC 14 filters the symbol and automatically controls a gain value of the symbol such that the symbol is converted into a unit of frame $s_i(n)$. Here, AGC is an abbreviation of "auto gain controller," and refers to automatically controlling of a gain value. The transmission side filter/AGC 14 may allow two functions to be separately performed by different devices.

The frame is converted into an analog signal by a digital to analog converter 15 to be transmitted through a speaker 16.

The low frequency ultrasonic receiving apparatus 20 receives a low frequency ultrasonic wave transmitted from the speaker 16 and recovers the transmission data 11 from the received low frequency ultrasonic wave.

The low frequency ultrasonic receiving apparatus 20 includes a microphone 22 that receives a low frequency ultrasonic wave and an analog to digital converter 21 that converts the received low frequency ultrasonic wave into a digital signal. The analog to digital converter 21 provides a reception signal $y_r(n)$.

Meanwhile, since influence caused by noise and attenuation is included in the reception signal, it is desirable that the noise and the attenuation should be eliminated. To this end, a reception side filter/AGC 23 filters only a target frequency of the reception signal to obtain an estimation frame $\hat{s}_i(n)$, and automatically controls a gain of the reception signal to obtain an estimation symbol $\hat{c}_i(n)$.

ADPSK demodulator 24 demodulates the estimation symbol to obtain qth bit information $\tilde{b}_i^q$ of an ith packet. Then, the demodulated information may be decoded by an FEC decoder to provide estimation data $\hat{b}_i^q$. The estimation data means the qth bit information of the ith packet, and may be reception data 26.

As the reception data is read, the performance of communication may be completed.

Operations of the low frequency ultrasonic communication system, the low frequency ultrasonic transmitting apparatus, and the low frequency ultrasonic receiving apparatus will be more accurately understood by the following description of a low frequency ultrasonic communication method. Therefore, contents not specified in the description of the low frequency ultrasonic communication system of FIG. 1 will refer to the following description of the low frequency ultrasonic communication method.

Figure 2:
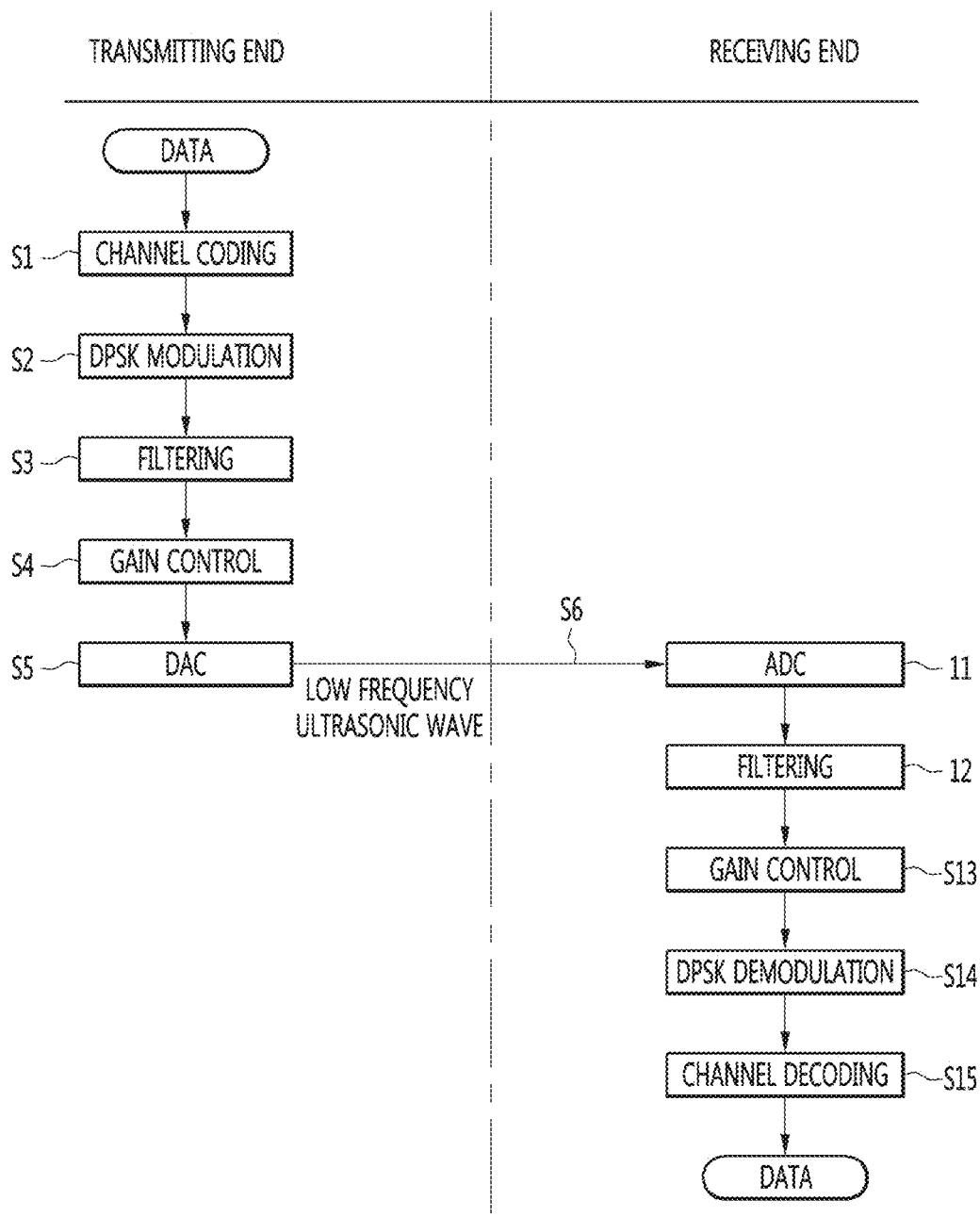
FIG. 2 is a flowchart illustrating a low frequency ultrasonic communication method.

FIG. 2 is a flowchart illustrating a low frequency ultrasonic communication method.

Referring to FIG. 2, digital data is channel-coded (S1). In detail, p bits may be processed using a packet as a unit. In the embodiment, an ith packet shown in Equation 1 may be provided by setting the p to 24 and providing 24 bits as a single packet.

$$b_i = [b_i^1 \ldots b_i^p \ldots b_i^P] \quad \text{Equation 1}$$

As the channel coder 12 performs FEC encoding on the ith packet, an additional error correction bit may be added.

Golay code may be used in the FEC encoding.

In detail, the channel coder 12 provides a coded block $\bar{b}_i$ by coding transmission data $b_i$ using the golay coder. According to the golay coder, the ith packet of Equation 1 may provide the coded block $\bar{b}_i$ of O×23. Here, subscript i of the coded block denotes a serial number of the packet, O is 2, and a code rate may be 52.17%.

The golay coder can decrease a bit error rate (BER) even when signal energy per bit (Eb/N0) is low. It will be apparent that another coder may be used, but a more desirable effect can be obtained because of the above-described features.

Each bit of the coded block $\bar{b}_i$ is modulated by the DPSK modulator 13 (S2). In detail, a symbol $c_i(n)$ is generated in the DPSK manner. Equation 2 represents a method for obtaining the symbol.

$$c_i(n) = w(n)\cos\left(\frac{2\pi f_c n}{f_s} + \pi(1 - d_i)\right) \quad \text{Equation 2}$$

Here, $d_i$ may be defined as shown in Equation 3.

$$d_i^q = \tilde{b}_i^q \nabla d_{i-1}^q \quad \text{Equation 3}$$

In Equation 3, $d_i^q$ denotes a qth differential coding bit of the ith packet. In $\tilde{b}_i^q$ and $d_i^q$, q may be given as 46 that is a total bit value (2×23) of the coded block in the golay coder. In Equation 3, $\nabla$ is an exclusive or (XOR) operator in a unit of bit, and may perform a differential operation. A value subjected to the differential operation by Equation 3 may be provided to Equation 2.

In Equation 3, the qth differential coding bit $d_i^q$ of the ith packet may be DPSK-modulated as an ith unit symbol in the form of a sinusoidal wave by Equation 2. In this case, the DPSK modulation may be performed such that a window is added by a framing window w(n).

The operation of Equation 2 will be described in detail.

In the symbol $c_i(n)$, n is a sampling index, and may have a value from 1 to $T_b$. The $T_b$ may be a length of the symbol. $f_c$ and $f_s$ are a carrier frequency and a sampling frequency, respectively. Here, the carrier frequency is a value of a low frequency ultrasonic wave, and may be 18 to 24 KHz, more preferably, 18 to 22 KHz. Among these frequencies, an arbitrary frequency may be used. The sampling frequency may be 48 KHz, which satisfies audio standards and corresponds to the Nyquist theorem. It will be apparent that the sampling frequency may be 44.1 KHz.

The framing window w(n) performs functions to smooth a discontinuous signal generated between the symbols, to attenuate undesired audible noise generated by the discontinuous signal. In the embodiment, a square root Hanning window may be used as the framing window. In addition, a Hanning window, a Kaiser window, a Bartlett window, etc. may be used. The framing window may allow a person not to hear a signal.

Figure 3A:
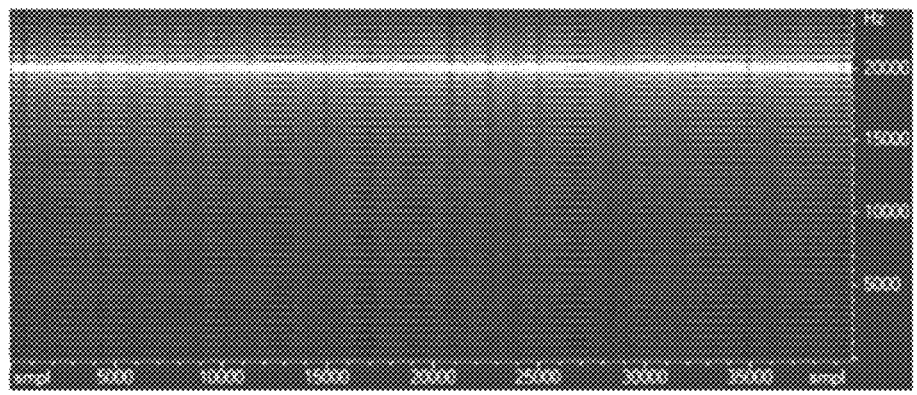
FIGS. 3a, 3b, and 3c are views illustrating an action of a framing window and a band pass filter.
Figure 3B:
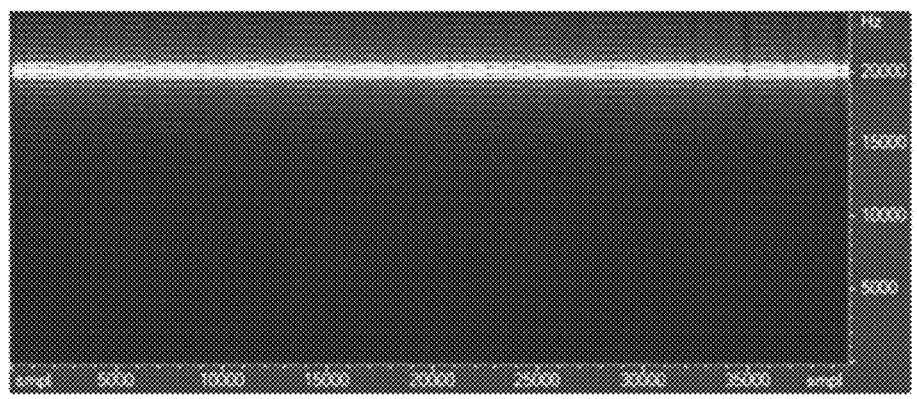
Figure 3C:
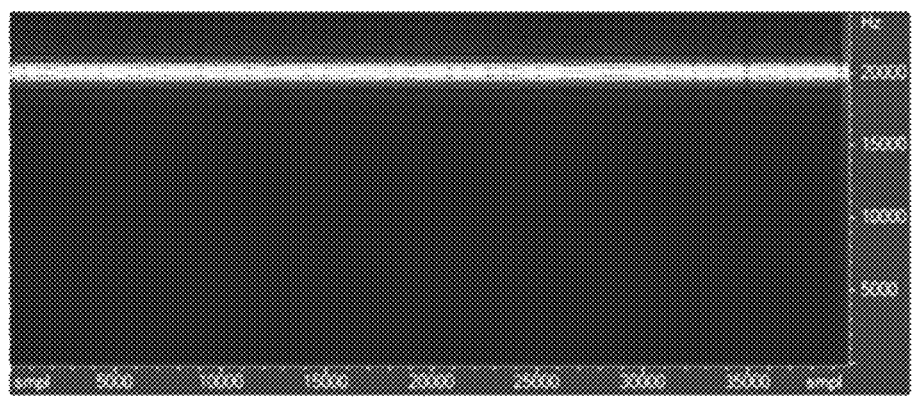

A difference between before the framing window is applied in Equation 2 and after the framing window is applied in Equation 2 is shown in (a), (b), and (c) of FIG. 3. Referring to (a), (b), and (c) of FIG. 3, it can be seen that the energy of audible noise except bands near the carrier frequency is remarkably decreased.

The length $T_b$ of the symbol is to maintain phase continuity between consecutive symbols. This is because discontinuity between the symbols may be heard by ears of a person. The length of the symbol may be evaluated using Equation 4.

$$T_b = N \frac{f_s}{gcd(f_c, f_s)} \quad \text{Equation 4}$$

Referring to Equation 4, function gcd(a,b) is a function for extracting the greatest common denominator, the greatest common denominator of the carrier frequency and the sampling frequency is obtained. N is an arbitrary natural number.

The length $T_b$ of the symbol is a factor that controls data transmission rates and communication robustness in various channel environments. In the embodiment, a length between symbols is controlled using the sampling frequency as the numerator in Equation 4 and the greatest common denominator of the sampling frequency and the carrier frequency as the denominator in Equation 4. Accordingly, it is possible to a phenomenon that data is not processed and pushed backward when a digital signal is processed in the DPSK manner, thereby smoothing connection between symbols. Furthermore, the occurrence of a spike value is prevented to allow a transmitted analog signal not to be heard by ears of a person.

After the modulation is performed through the above-described process, filtering is performed on each symbol (S3). The filtering may be formed using Equation 5. Here, the filtering is performed to filter a low frequency harmonic component of a modulation signal generated in phase inversion between other adjacent symbols. Accordingly, a signal heard by ears of a person can be removed.

$$\tilde{c}_i(n) = \sum_{m=0}^{M} c_i(n-m)g(m) \qquad \text{Equation 5}$$

Here, g(m) denotes a band pass filter, and cut-off frequencies of the band pass filter may be given as $f_c-f_b$ and $f_c+f_b$. Here, $f_b$ may be given as Equation 6.

$$f_b = \frac{f_s}{T_b} \qquad \text{Equation 6}$$

Here, it has already been described that the length $T_b$ of the symbol is a value that relies on the sampling frequency, the carrier frequency, and a natural number.

States before and after band pass filtering is performed using Equations 5 and 6 are shown in (a) and (b) of FIG. 4, respectively. Referring to FIG. 4, it can be seen that the harmonic component has been removed.

After the band pass filtering is performed using Equation 5, a gain of a carrier wave is controlled (S4). The control of the gain may be performed using Equation 7. The control of the gain is performed to correspond to attenuation by allowing the gain to be as maximum as possible.

$$s_i^{T_b}(n) = \frac{G\tilde{c}_i(n)}{\frac{1}{T_b}\sum_{n=1}^{T_b}|\tilde{c}_i(n)|} \qquad \text{Equation 7}$$

Here, G denotes a normalized scale, and may be set to 214 in the embodiment. This is a half of the maximum value of a sample having a depth of 16 bits. States before and after the gain is controlled using Equation 7 are shown in FIGS. 4a and 4b. Referring to FIG. 4b, it can be seen that energy in a desired frequency band is increased.

An ith frame $s_i(n)$ acquired by Equation 7 is digital to analog converted (S5), and is spread in the form of a low frequency ultrasonic wave in the air through the speaker 16 (S6). Here, the speaker 16 is a general speaker, and a ready-made product capable of outputting a maximum of 24 KHz within an engineering error range may be used as the speaker 16.

The low frequency ultrasonic receiving apparatus 20 recovers the transmission data 11 by receiving the low frequency ultrasonic wave transmitted from the speaker 16. As the frame is spread as an air wave, the frame undergoes a change as shown in Equation 8 and then is received to a receiving end. The receiving end reversely processes a signal transmitted by a transmitting end, and processing may be performed in the opposite direction to the processing direction of the receiving end. Therefore, detailed mathematical processing may refer to the processing of the receiving end.

$$y_i(n) = H(z) * s_i^{T_b}(n) + d_i(n) \qquad \text{Equation 8}$$

Here, H(z) denotes a propagation channel that has influence on the frame, $d_i(n)$ denotes noise, and $y_i(n)$ denotes a reception signal.

In the receiving end, the analog to digital converter 21 acquires the reception signal $y_i(n)$ (S11), and provides an estimation frame $\hat{s}_i(n)$ using a carrier frequency band pass filter (S12). Specifically, the estimation frame may be obtained using Equation 9.

$$\hat{s}_i(n) = \sum_{m=0}^{M} y_i(n-m)g(m) \qquad \text{Equation 9}$$

Here, $y_i(n)$ is the reception signal, and g(m) is the carrier frequency band pass filter.

After that, gain control is performed (S13). The gain control is used to compensate for energy loss caused by frequency selectivity of the propagation channel, and may be performed as shown in Equation 10.

$$\hat{c}_i(n) = \frac{G\hat{s}_i(n)}{\frac{1}{T_b}\sum_{n=1}^{T_b}|\hat{s}_i(n)|} \qquad \text{Equation 10}$$

An estimation symbol $\hat{c}_i(n)$ may be obtained using Equation 10.

Figure 5A:
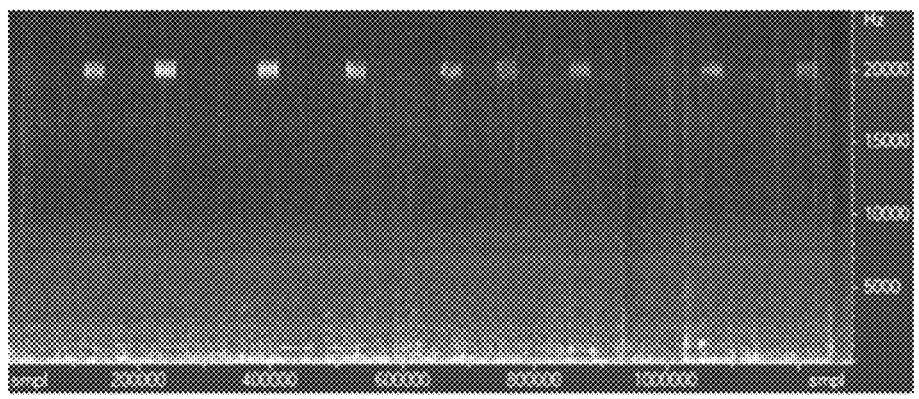
FIGS. 5a, 5b and 5c are views illustrating the band pass filter and a result of gain control at a receiving end.
Figure 5B:
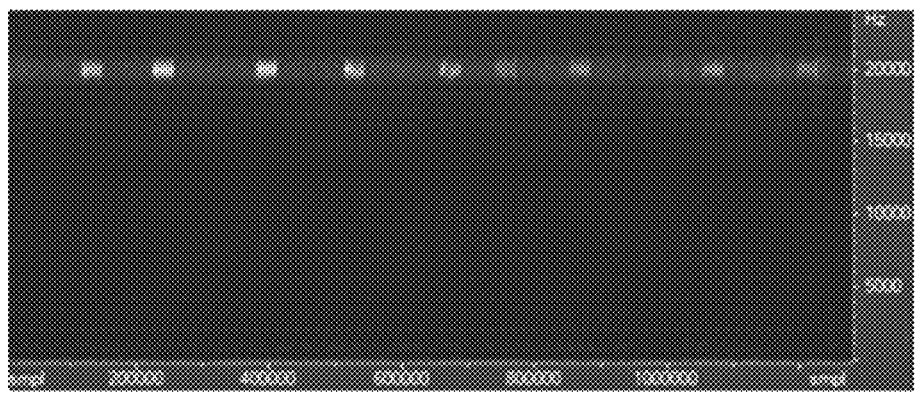
Figure 5C:
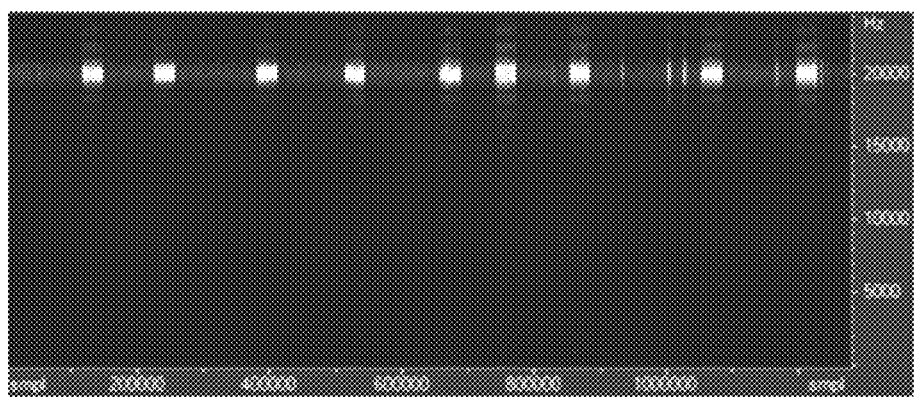

A result of the band pass filtering performed using Equation 9 and a result of the gain control performed using Equation 10 will be described with reference to FIGS. 5a, 5b, and 5c. First, FIGS. 5a, 5b, and 5c illustrate results of the band pass filtering. If the results are compared, it can be seen that noises in all bands except a carrier frequency band are all filtered. In addition, FIGS. 5a5b and 5c illustrate results of the gain control. If the results are compared, it can be seen that a gain is amplified with respect to only a section in which a communication symbol signal exists in the carrier frequency band.

After that, the estimation symbol may be DPSK-demodulated to obtain qth bit information $\overline{b}_i^q$ of the ith packet (S14). Specifically, the DPSK demodulation may be performed as shown in Equation 11.

$$\overline{b}_i^q = \begin{cases} 1 & \text{if } \sum_{n=1}^{T_b} \hat{c}_i(n)\hat{c}_{i-1}(n) > 0 \\ 0 & \text{otherwise} \end{cases} \qquad \text{Equation 11}$$

Equation 11 represents a process of performing the DPSK demodulation.

After that, the demodulated information, i.e., a result of Equation 11 may provide FEC decoding estimation data through channel decoding (S15). It will be apparent that the golay coding may be used in the FEC decoding.

By performing the above-described process, smooth communication can be performed using the low frequency ultrasonic wave.

In order to test the present disclosure, the inventor performed an experiment on various lengths $T_b$ of the symbol and various distances under an environment in which noise exists. Specific test conditions are as follows.

First, the distance was increases in a unit of 2 m from 0 m to 20 m, and the length of the symbol was increased in a unit of 12 from 12 to 288. As the noise $d_i(n)$ was recorded using an MEMS system microphone built in a smart phone, an average sound pressure level was 50 dB, and a sampling rate and a number of sampling bits, which are used to record noise, were 48 KHz and 16, respectively.

Figure 6:
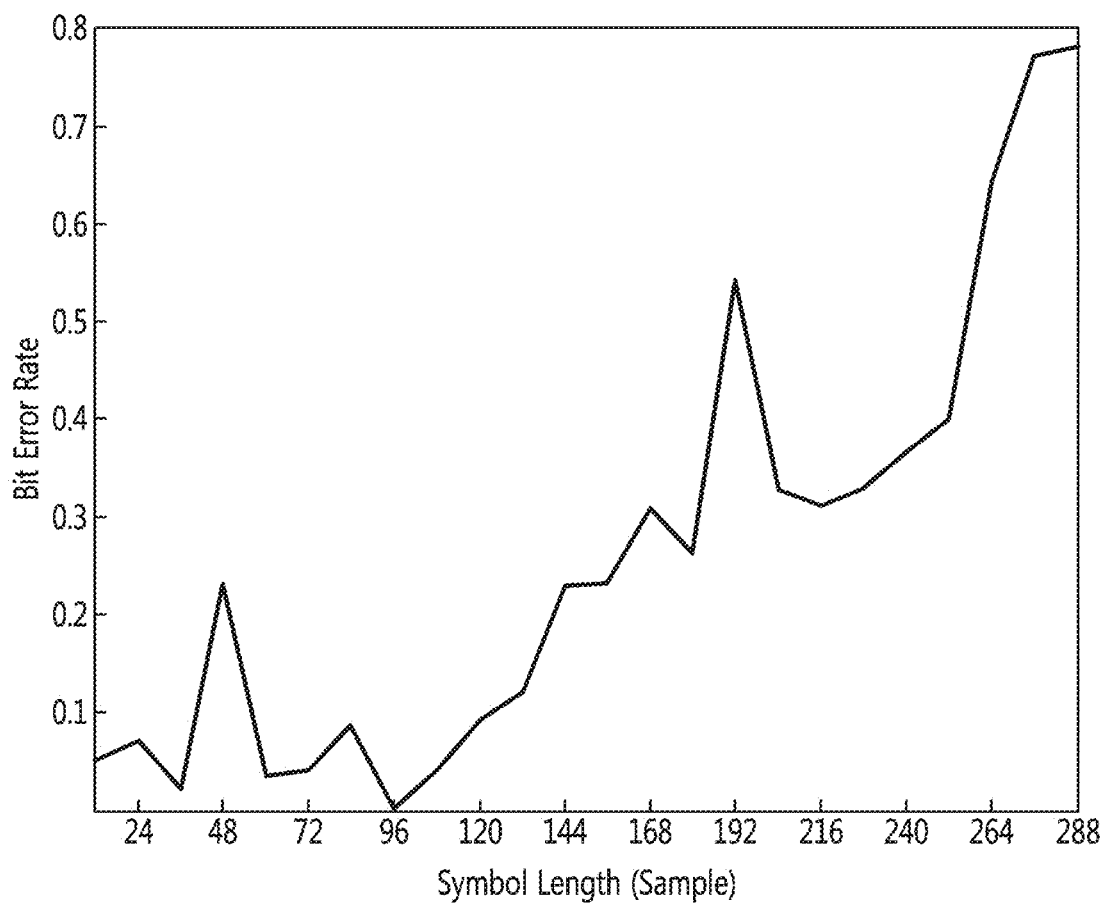
FIG. 6 is a view illustrating bit error rate (BER) when the length of a symbol is changed.

FIG. 6 is a view illustrating bit error rate (BER) when the length of a symbol is changed.

Referring to FIG. 6, it can be seen that, when the length of the symbol is 96, the BER is lowest under an experimental environment. Therefore, the length of the symbol was set to 96 when an experiment was performed under the following actual experiment.

The inventor performed an experiment on communication success rates of the proposed embodiment under various noise environments. Specifically, the inventor measured communication success rates according to a physical distance between the transmitting apparatus and the receiving apparatus under three life noise environments, i.e., a bus stop, the inside of a coffee shop, and an urban area. The distance was measured in a unit of 0.2 m from 0 m to 20 m. In order to ensure the statistical reliability of measured results, transmission was performed twenty times with respect to 50 letters randomly generated for each life noise group and each distance.

Hereinafter, results of the experiment will be described with reference to the accompanying drawings.

Figure 7A:
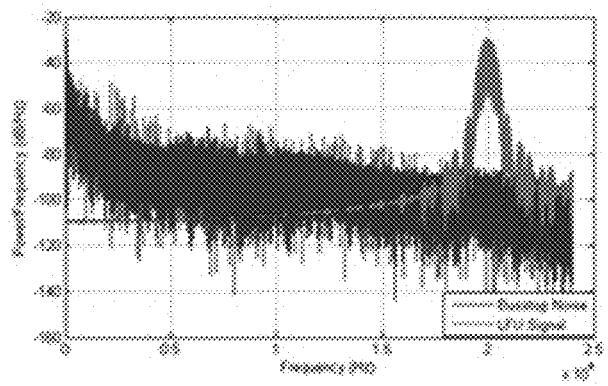
FIGS. 7a, 7b, and 7c are views illustrating frequency spectrum characteristics of low frequency ultrasonic communication signals generated in actual noise environments.
Figure 7B:
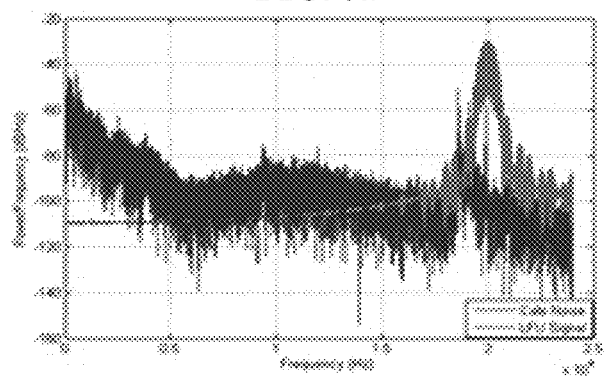
Figure 7C:
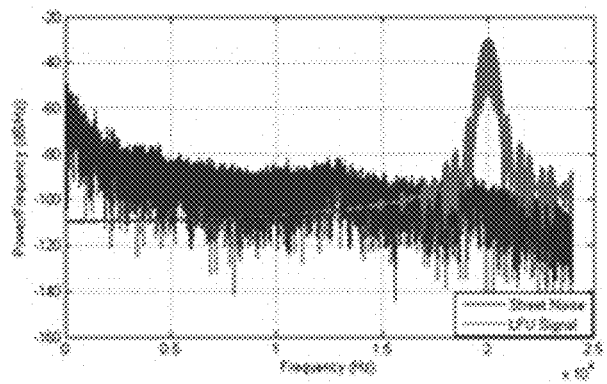

FIGS. 7(a), 7(b), and 7(c) are views illustrating frequency spectrum characteristics of low frequency ultrasonic communication signals generated in actual noise environments. Here, (a) of FIG. 7 illustrates a frequency spectrum characteristic of a low frequency ultrasonic communication signal generated in a bus stop, (b) of FIG. 7 illustrates a frequency spectrum characteristic of a low frequency ultrasonic communication signal generated in the inside of a coffee shop, and (c) of FIG. 7 illustrates a frequency spectrum characteristic of a low frequency ultrasonic communication signal generated in an urban area.

Referring to FIGS. 7(a), 7(b), and 7(c), it can be seen that, since the low frequency ultrasonic communication signals are high by 40 to 50 dB in the carrier frequency band as compared with the actual noise environments, robust communication is possible even in everyday noises.

Figure 8:
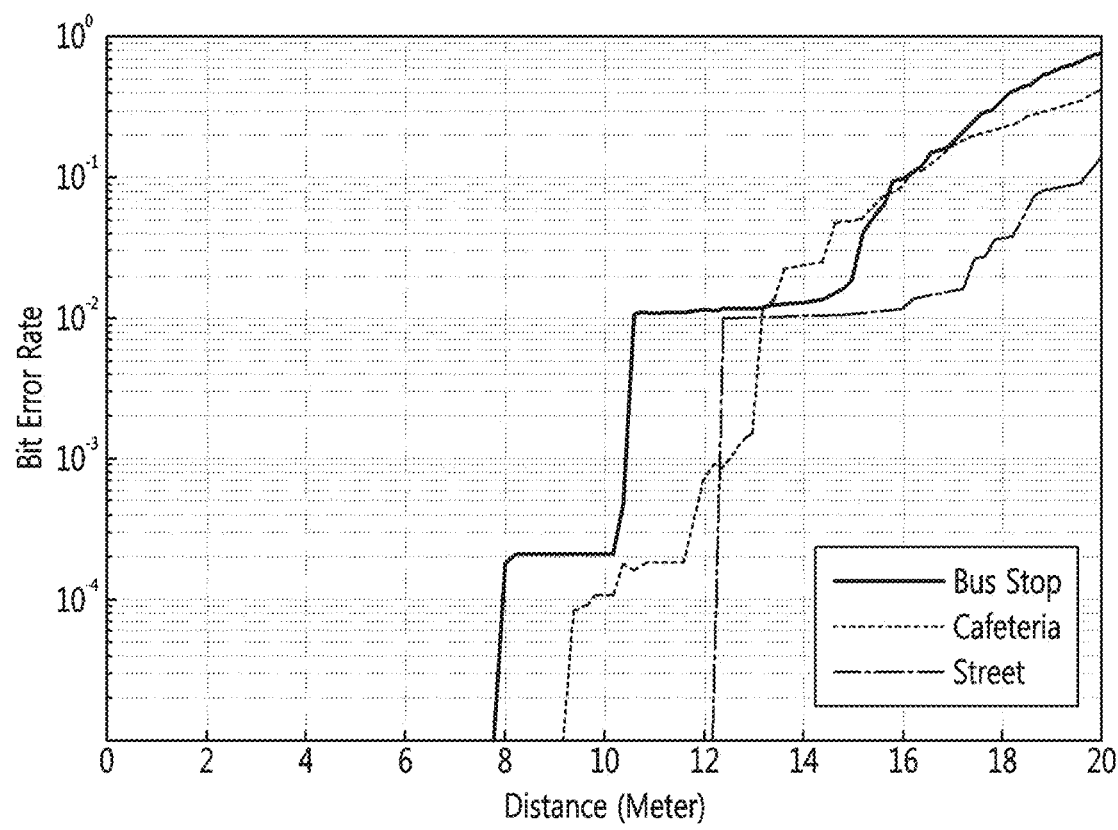
FIG. 8 is a view illustrating change in BER with respect to distance for each noise environment.

FIG. 8 is a view illustrating change in BER with respect to distance for each noise environment.

Referring to FIG. 8, it can be seen that communication with no error is possible up to about 8 m in the bus stop, up to about 9 m in the interior of the coffee shop, and up to about 12 m in the urban area.

According to these results, in the embodiment, it can be seen that robust communication is possible up to about 10 m at a speed of 500 bps in actual noise environments.

The present disclosure can provide a platform where communication can be sufficiently performed using a general terminal equipped with a speaker and a microphone even when a separate communication device does not exist. Thus, the present disclosure can be applied to short-range communication application fields of all devices each including a terminal, using an appropriate communication method.

According to the present disclosure, communication can be performed in all devices each having a speaker and a microphone even when separate hardware is not provided. Thus, a new challenge can be issued to application fields of NFC and Bluetooth, and communication can be performed by providing only software.

According to the present disclosure, communication of all electronic devices each having any one of a speaker and a microphone, such as TV/remote controller, TV/terminal, computer/computer, and terminal/terminal, can be performed with industrial purposes. Thus, it can be expected that ripple effects that influence several industrial fields will be considerable.

The foregoing embodiments are merely exemplary and are not to be considered as limiting the present disclosure. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A low frequency ultrasonic communication system comprising:
   a low frequency ultrasonic transmitting apparatus configured to transmit data using a low frequency ultrasonic wave; and
   a low frequency ultrasonic receiving apparatus configured to recover the data by processing a low frequency ultrasonic reception signal transmitted from the low frequency ultrasonic transmitting apparatus,
   wherein the low frequency ultrasonic transmitting apparatus includes:
      a differential phase shift keying (DPSK) modulator configured to provide a symbol by performing DPSK modulation on digital data using a framing window, wherein the framing window smooths a discontinuous signal generated between symbols;
      a transmission side filter and auto gain controller (AGC) configured to convert the symbol into a frame by filtering the symbol and controlling a gain;
      a digital to analog converter configured to convert the frame into an analog signal; and
      a speaker configured to transmit the analog signal using the low frequency ultrasonic wave; and
   wherein the low frequency ultrasonic receiving apparatus includes:
      a microphone configured to receive the low frequency ultrasonic wave;
      an analog to digital converter configured to convert a signal received as an analog signal into a digital reception signal;
      a reception side filter/AGC configured to filter the received signal and control a gain to obtain an estimation symbol estimated from the received signal; and
      a DPSK demodulator configured to acquire the digital data by performing DPSK demodulation on the estimation symbol.

2. The low frequency ultrasonic communication system of claim 1, wherein the low frequency ultrasonic transmitting apparatus further includes a channel coder configured to provide the digital data by performing FEC encoding on original data, and wherein the low frequency ultrasonic receiving apparatus further includes a channel decoder configured to provide the original data by performing FEC decoding on the digital data.

3. A low frequency ultrasonic communication method comprising:

channel-coding digital data;

DPSK-modulating a coding block coded through the channel-coding using a framing window to provide a symbol, wherein the framing window smooths a discontinuous signal generated between symbols;

filtering the symbol;

acquiring a frame by controlling a gain of the filtered symbol;

generating an analog signal by performing digital to analog conversion on the frame; and transmitting the analog signal in the air using a low frequency ultrasonic wave.

4. The low frequency ultrasonic communication method of claim 3, wherein the channel coding is performed as FEC coding.

5. The low frequency ultrasonic communication method of claim 4, wherein a Golay code is used as the FEC coding.

6. The low frequency ultrasonic communication method of claim 3, wherein the DPSK modulation is formed using Equation:

$$c_i(n) = w(n)\cos\left(\frac{2\pi f_c n}{f_s} + \pi(1 - d_i)\right),$$

wherein is a modulated symbol, n is a sampling index and has a value from 1 to $T_b$, $f_c$ is a carrier frequency, $f_s$ is a sampling frequency, w(n) is a framing window, and $d_i$ is defined by Equation:

$$d_i^q = \tilde{b}_i^q \nabla d_{i-1}^q,$$

wherein $\tilde{b}_i^q$ is a coding block, q is a total bit value of the coding block, and $\nabla$ is an XOR operator in a unit of bit.

7. The low frequency ultrasonic communication method of claim 6, wherein the $T_b$ is acquired using Equation:

$$T_b = N \frac{f_s}{\gcd(f_c, f_s)},$$

wherein N is an arbitrary natural number, and gcd(a,b) is a function for acquiring the greatest common denominator of a and b.

8. The low frequency ultrasonic communication method of claim 3, wherein the filtering of the symbol is performed using Equation:

$$\tilde{c}_i(n) = \sum_{m=0}^{M} c_i(n-m)g(m),$$

wherein $c_i(n)$ is a modulated symbol, and g(m) is a band pass filter.

9. The low frequency ultrasonic communication method of claim 8, wherein a cutoff frequency of the band pass filter is given as $f_c - f_b$ and $f_c + f_b$, wherein $f_b$ is given as Equation:

$$f_b = \frac{f_s}{T_b}.$$

10. The low frequency ultrasonic communication method of claim 3, wherein the controlling of the gain of the symbol is performed using Equation:

$$s_i^{T_b}(n) = \frac{G\tilde{c}_i(n)}{\frac{1}{T_b}\sum_{n=1}^{T_b}|\tilde{c}_i(n)|},$$

wherein G denotes a normalized scale, $T_b$ is a length of the symbol $\tilde{c}_i(n)$ is a filtered symbol.

11. The low frequency ultrasonic communication method of claim 3, wherein the frequency of the low frequency ultrasonic wave is 18 to 24 KHz.

12. A low frequency ultrasonic communication method comprising:

receiving an analog signal transmitted through:

channel-coding digital data;

DPSK-modulating a coding block coded through the channel-coding using a framing window to provide a symbol, wherein the framing window smooths a discontinuous signal generated between symbols;

filtering the symbol;

acquiring a frame by controlling a gain of the filtered symbol;

generating an analog signal by performing digital to analog conversion on the frame; and transmitting the analog signal in the air using a low frequency ultrasonic wave; and converting the received analog signal into a reception signal processed as a digital signal;

acquiring an estimation frame from the reception signal using a carrier band pass filter;

acquiring an estimation symbol by controlling a gain of the estimation frame;

acquiring bit information by performing DPSK demodulation on the estimation symbol; and acquiring estimation data by channel-decoding the bit information.

* * * * *